(12) United States Patent
Lee et al.

(10) Patent No.: US 9,281,179 B2
(45) Date of Patent: Mar. 8, 2016

(54) METHODS OF FABRICATING SEMICONDUCTOR DEVICES

(75) Inventors: Mongsup Lee, Seoul (KR); Inseak Hwang, Suwon-Si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 907 days.

(21) Appl. No.: 13/303,317

(22) Filed: Nov. 23, 2011

(65) Prior Publication Data

US 2012/0164830 A1  Jun. 28, 2012

(30) Foreign Application Priority Data

Dec. 23, 2010 (KR) .................. 10-2010-0133492

(51) Int. Cl.
*H01L 21/322* (2006.01)
*H01L 21/02* (2006.01)
*H01L 21/3065* (2006.01)
*H01L 21/768* (2006.01)
*H01L 27/108* (2006.01)
*H01L 21/00* (2006.01)

(52) U.S. Cl.
CPC ...... *H01L 21/02063* (2013.01); *H01L 21/3065* (2013.01); *H01L 21/76805* (2013.01); *H01L 21/76814* (2013.01); *H01L 27/10855* (2013.01); *H01L 27/10888* (2013.01)

(58) Field of Classification Search
CPC .................. H01L 21/02002; H01L 21/02299;
H01L 21/02658; H01L 21/76804; H01L
21/76805; H01L 21/76813; H01L 21/76897;
H01L 21/02063; H01L 21/3065; H01L
21/76814
USPC ......... 438/675, 700, 705, 706–707, 710–727;
257/E21.214–E21.227, E21.249,
257/E21.483, 21.485, 21.585
See application file for complete search history.

(56) References Cited

U.S. PATENT DOCUMENTS

2006/0108576 A1* 5/2006 Laermer et al. .............. 257/40
2006/0194435 A1* 8/2006 Nishimura et al. .......... 438/689
2006/0199399 A1* 9/2006 Muscat ........................ 438/798

FOREIGN PATENT DOCUMENTS

| DE | 19847455 A1 * | 4/2000 |
| JP | 08-250478 | 9/1996 |
| JP | 08-045668 | 2/1997 |
| KR | 1020010005105 | 1/2001 |

* cited by examiner

*Primary Examiner* — Calvin Choi
(74) *Attorney, Agent, or Firm* — F. Chau & Associates, LLC

(57) ABSTRACT

Provided is a method of fabricating a semiconductor device. The method includes: preparing a substrate with an etching target, and etching the etching target through a plasma-free etching process that uses an etching gas including one of interhalogen compound, $F_2$, $XeF_2$ and combinations thereof.

15 Claims, 15 Drawing Sheets

METHODS OF FABRICATING SEMICONDUCTOR DEVICES

CROSS-REFERENCE TO RELATED APPLICATION

This U.S. non-provisional patent application claims priority under 35 U.S.C. §119 to Korean Patent Application No. 10-2010-0133492, filed on Dec. 23, 2010, the entire contents of which are hereby incorporated by reference.

BACKGROUND

Embodiments of the present inventive concept herein relate to methods of fabricating semiconductor devices.

Demands for light, small, high-speed, multifunctional, high-performance, highly reliable, and low-priced products have increased in electronics industries such as the mobile phone and notebook device industries. To satisfy these demands, the degree of integration in semiconductor devices has been increased, to obtain a manufacturing margin of a semiconductor device, and also to improve electrical characteristics and reliability of the semiconductor devices.

In order to satisfy the above demands in the semiconductor device, various studies relating to manufacturing processes of semiconductor devices are in progress.

SUMMARY

Embodiments of the present inventive concept provide methods of fabricating a semiconductor device with improved reliability and electrical characteristics, and methods of fabricating a semiconductor device resulting in a manufacturing margin.

Embodiments of the inventive concept provide methods of fabricating a semiconductor device including preparing a substrate with an etching target, and etching the etching target through a plasma-free etching process that uses an etching gas including one of an interhalogen compound, $F_2$, $XeF_2$, and combinations thereof.

In some embodiments, the etching target may include a plasma-damaged region that is removed through the plasma-free etching process.

In some embodiments, the methods may further include performing a hydrogen replacement process on the substrate after the plasma-free etching process is performed.

In some embodiments, the hydrogen replacement process may include: providing gas with hydrogen on the substrate where the plasma-free etching process has been performed, and performing a thermal treatment process on the substrate.

In some embodiments, the gas with hydrogen may include one of hydrogen fluoride, ammonia, nitrogen fluoride and combinations thereof.

In some embodiments, the plasma-free etching process may be an isotropic etching process.

In some embodiments, the etching target may include silicon.

In some embodiments, the plasma-free etching process may be performed at room temperature to about 300° C. and at a manufacturing pressure of about 0.00001 atm to about 1 atm.

In some embodiments, the etching gas of the plasma-free etching process may further include an inert gas.

In some embodiments, the preparing of the substrate including the etching target may include: forming an insulation layer on the substrate, and forming an opening that penetrates the insulation layer to expose a portion of the substrate, wherein the etching of the etching target includes forming a recess region in the substrate by etching the exposed portion substrate exposed through the opening.

In some embodiments, the longest width of the recess region may be wider than a width of a bottom end of the opening.

In some embodiments, the methods may further include forming a conductor in the opening and in the recess region.

In yet further embodiments, the etching target may include a natural oxide layer, and the method may further include, before performing the plasma-free etching process, performing a pre-etching process for removing the natural oxide layer.

In some embodiments, the pre-etching process may use a process gas including one of hydrogen fluoride, ammonia, nitrogen fluoride, and combinations thereof.

In some embodiments, the process gas of the pre-etching process may further include an inert gas.

In some embodiments, the pre-etching process may be performed at room temperature to about 300° C. and at a manufacturing pressure of about 0.00001 atm to about 1 atm.

In some embodiments, an etch rate of the etching target by the etching gas may be about 90 times to about 100 times higher than that of a silicon oxide by the etching gas.

In some embodiments, an etch rate of the etching target by the etching gas may be about 40 times to about 60 times higher than that of a silicon nitride by the etching gas.

A method of fabricating a semiconductor device, in accordance with an embodiment of the inventive concept, comprises forming an insulation layer on a substrate, etching the insulation layer using a plasma process to form an opening in the insulation layer, the opening exposing a portion of the substrate, and etching the exposed portion of the substrate using a plasma-free process, wherein the etching gas for the plasma-free process has a higher etch selectivity with respect to the substrate than with respect to the insulation layer.

An etch rate of the substrate by the etching gas may be about 50 to about 100 times faster than an rate of the insulation layer by the etching gas.

The etching gas may include one of an interhalogen compound, $F_2$, $XeF_2$, or combinations thereof.

A portion of the substrate under the insulation layer to a side of the opening may be etched during the plasma-free process.

The method may further comprise performing a pre-etching process for removing a natural oxide layer from the exposed portion of the substrate before performing of the plasma-free process.

BRIEF DESCRIPTION OF THE DRAWINGS

The accompanying drawings are included to provide a further understanding of the embodiments of the inventive concept, and are incorporated in and constitute a part of this specification. In the drawings.

DETAILED DESCRIPTION OF THE EMBODIMENTS

Figure 1:
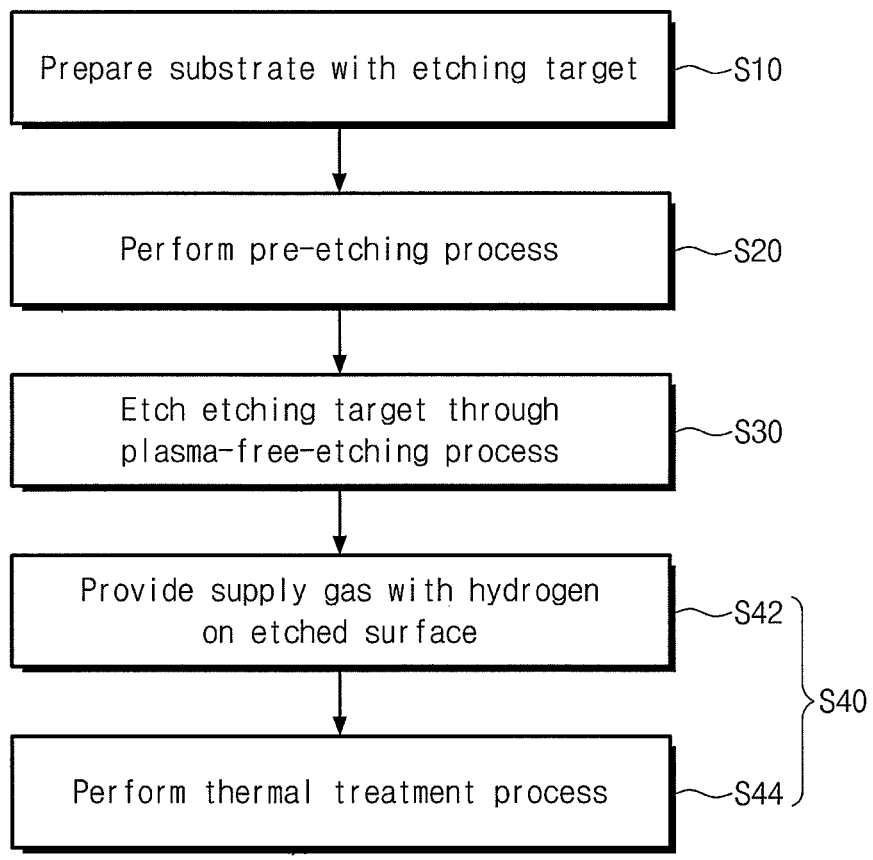
FIG. 1 is a flowchart illustrating a method of fabricating a semiconductor device according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein.

It will be understood that when an element such as a layer, film, region, or substrate is referred to as being "on" another element, it can be directly on the other element or intervening elements may also be present.

Like reference numerals may refer to like elements throughout.

A method of fabricating a semiconductor device according to embodiments of the inventive concept is described. FIG. 1 is a flowchart illustrating a method of fabricating a semiconductor device according to an embodiment of the inventive concept. FIGS. 2A through 2D are sectional views illustrating a method of fabricating a semiconductor device according to an embodiment of the inventive concept.

Figure 2A:
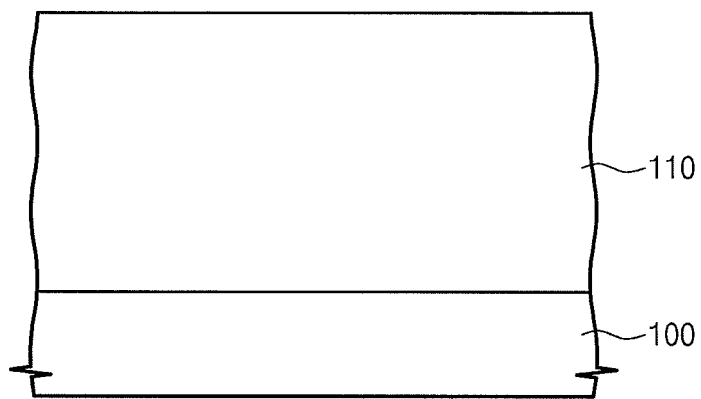
FIGS. 2A through 2D are sectional views illustrating a method of fabricating a semiconductor device according to an embodiment of the inventive concept.

Referring to FIGS. 1 and 2A, an insulation layer 110 is formed on a substrate 100. The insulation layer 110 is formed through a Physical Vapor Deposition (PVD) process, a Chemical Vapor Deposition (CVD) process, or an Atomic Layer Deposition (ALD) process. The insulating layer 110 is single-layered or multi-layered. The insulation layer 110 includes, for example, at least one of oxide, nitride, or oxynitride. The substrate 100 includes a semiconductor material. For example, the substrate 100 may be at least one of a silicon substrate or a silicon-germanium substrate.

Figure 2B:
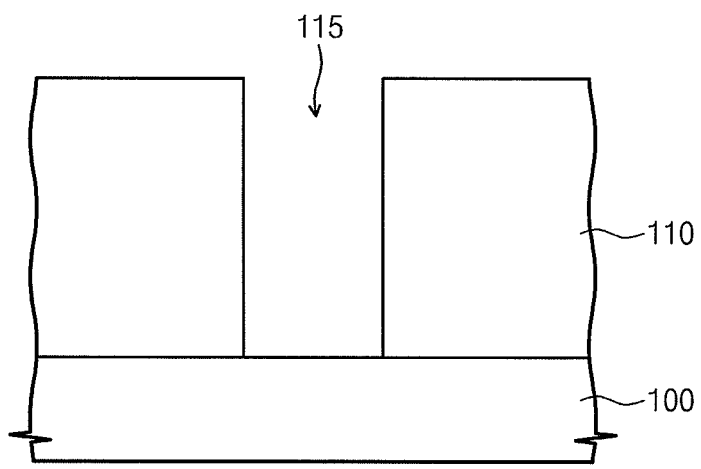

Referring to FIGS. 1 and 2B, an opening 115 penetrating the insulation layer 110 and exposing the top surface of the substrate 100 is formed in the insulation layer 110 in operation S10. According to an embodiment, the opening 115 may have a hole shape or a thinner line shape. According to an embodiment, forming of the opening 115 includes forming a mask pattern on the insulation layer 110 and etching the insulation layer 110 using the mask pattern as an etch mask.

According to an embodiment, etching of the insulation layer 110 is performed through an anisotropic etching process using plasma. Since the anisotropic etching process uses plasma, a plasma damaged region may be formed in an upper region of the substrate 100 exposed through the opening 115. The plasma damaged region is a region where bonding between semiconductor atoms is broken at the top surface of the substrate 100 by the plasma used for the anisotropic etching process.

Figure 2C:
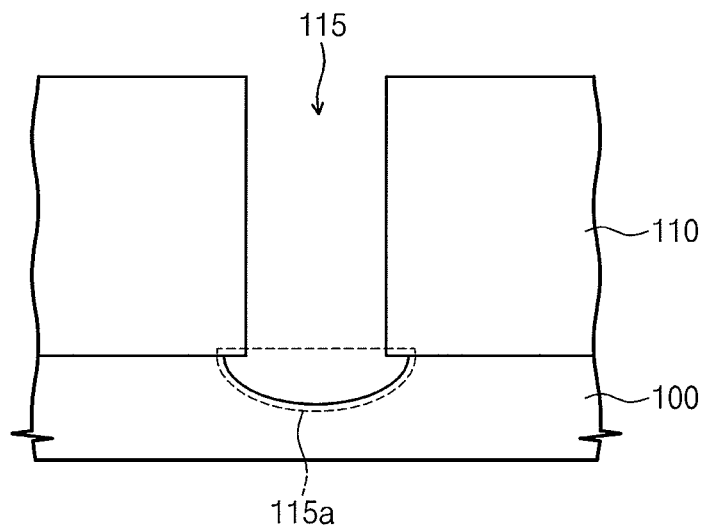

Referring to FIGS. 1 and 2C, a recess region 115a is formed in the substrate 100 by performing a plasma-free-etching process on a top region of the substrate 100 exposed through the opening 115 in operation S30. The recess region 115a is formed in the substrate 100 by performing the plasma-free-etching process using etching gas on portion of the substrate 100 exposed through the opening 115. In the plasma-free-etching process, a portion of the substrate 100 is etched by a reaction between the top region of the substrate 100 exposed through the opening 115 and the etching gas. Since the plasma-free-etching process is performed without plasma, a plasma damaged region is prevented or reduced in the inner surface of the recess region 115a formed through the plasma-free-etching process.

The etching gas includes gases that react with a semiconductor material in the substrate 100. For example, if the substrate 100 includes silicon, the etching gas may include one of an interhalogen compound, $F_2$, $XeF_2$, and combinations thereof. For example, the interhalogen compound is at least one of fluorine-bromine compound (e.g., $BrF$, $BrF_3$ or $BrF_5$), chlorine-fluorine compound (e.g., $ClF$, $ClF_3$, or $ClF_5$), or iodine-fluorine compound (e.g., $IF_3$ or $IF_5$).

According to an embodiment, the etching gas has a high etch selectivity with respect to the substrate 100. That is, an etch rate of the etching gas on the substrate 100 is higher than an etch rate of the etching gas on the insulation layer 110. For example, according to an embodiment, if the substrate 100 includes silicon and the insulation layer 110 includes silicon oxide, an etch rate of the substrate 100 by the etching gas is 100 times higher than that of the insulation layer 110 by the etching gas. Additionally, if the substrate 100 includes silicon and the insulation layer 110 includes silicon nitride, an etch rate of the substrate 100 by the etching gas is, for example, 50 times higher than that of the insulation layer 110 by the etching gas. Accordingly, the insulation layer 110 is minimally etched during the plasma-free etching process.

According to an embodiment, the plasma-free-etching process is performed at room temperature to about 300° C. and at a manufacturing pressure of about 0.00001 atm to about 1 atm. According to an embodiment, the etching gas may further include an inert gas. For example, the etching gas may include argon. As an alternative, or in addition to the argon, the etching gas may include nitrogen.

According to an embodiment, the plasma-free-etching process is an isotropic etching process. According to an embodiment, the recess region 115a crosses over a sidewall of the opening 115 and extends in a side direction under part of the insulation layer 110 through the isotropic etching process. That is, a width of the recess region 115a is longer than the width of a bottom end of the opening 115.

Before performing the plasma-free-etching process, a pre-etching process for removing a natural oxide layer formed on the top surface of the substrate exposed through the opening 115 is performed in operation S20.

After the forming of the opening 115, a natural oxide layer is formed on the top surface of the substrate 100 exposed through the opening 115. The pre-etching process removes the natural oxide layer on the top surface of the substrate 100 by using process gas. The pre-etching process removes the natural oxide layer through a reaction between the natural oxide layer on the top surface of the substrate 100 and the process gas, without using plasma. Since the pre-etching process is performed without plasma, formation of a plasma damaged region on the surface of a substrate on which the pre-etching process is performed is minimized or prevented.

The process gas includes gases that react with an oxide in the natural oxide layer. For example, if the natural oxide layer includes silicon oxide, the process gas includes at least one of ammonia, hydrogen fluoride, or nitrogen fluoride. According to an embodiment, the pre-etching process is performed at room temperature to about 300° C. and at a manufacturing pressure of about 0.00001 atm to about 1 atm. According to an embodiment, the process gas further includes an inert gas, such as, argon and/or nitrogen.

According to an embodiment, the pre-etching process is an isotropic etching process. Accordingly, an inner sidewall of the opening 115 is etched in a side direction during the pre-etching process. The width of the opening 115 may be increased since the opening 115 is etched when the process gas used in the pre-etching process reacts with the insulation layer 110 exposed through the opening 115.

A hydrogen replacement process is further performed on the substrate 100 having the recess region 115a. The hydrogen replacement process includes providing gas with hydrogen on the inner surface of the recess region 115a in operation S42 and performing a thermal treatment process on the substrate 100 in operation S44. The gas with hydrogen includes, for example, at least one of hydrogen fluoride or ammonia. The thermal treatment process is performed at about 150° C. to about 250° C.

A semiconductor-halogen compound, where a halogen element in the etching gas used in the plasma-free-etching process and a semiconductor element in the inner surface of the recess region 115a are combined, is formed in the recess region 115a. The hydrogen replacement process changes the semiconductor-halogen compound into a semiconductor-hydrogen compound.

A semiconductor-hydrogen compound having a stronger coherence than a semiconductor-halogen compound is formed in the inner surface of the recess region 115a through the hydrogen replacement process so that formation of a natural oxide layer in the inner surface of the recess region 115a is prevented or minimized.

Figure 2D:
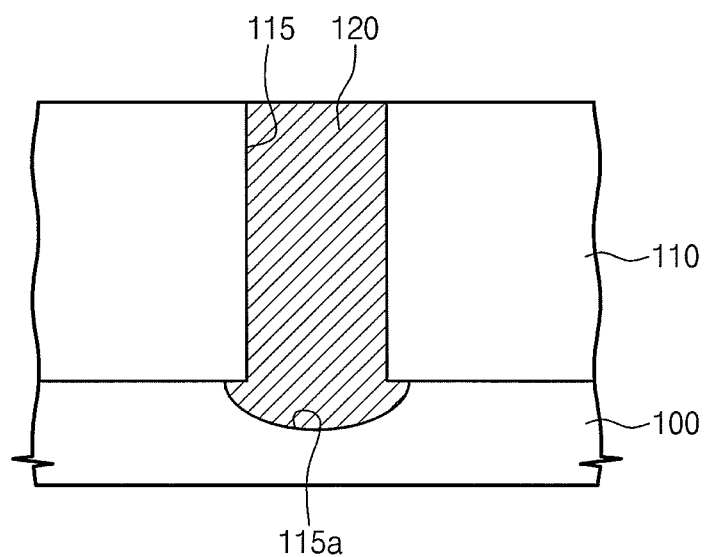

Referring to FIG. 2D, a conductor 120 is formed in the opening 115 and the recess region 115a. The conductor 120 includes at least one of semiconductor material (e.g., polycrystal silicon), metal-semiconductor compound (e.g., tungsten silicide), conductive metal nitride (e.g., titanium nitride, tantalum nitride or tungsten nitride), or metal (e.g., titanium, tungsten, or tantalum). According to an embodiment, the conductor 120 contacts the opening 115 and the inner surface of the recess region 115a.

The forming of the conductor 120 includes forming a conductive layer that fills the opening 115 and the recess region 115a on the insulation layer 110 and removing the conductive layer until the top surface of the insulation layer 110 is exposed. The conductive layer is formed through, for example, a CVD process or PVD process. The removal of the conductive layer from on the insulation layer 110 is performed through at least one of an etch back process and a chemical mechanical planarization process.

According to embodiments of the inventive concept, after forming the opening 115, the recess region 115a is formed through a plasma-free-etching process. Accordingly, formation of a plasma damaged region on the inner surface of the recess region 115a may be minimized or prevented. If the recess region is formed through an isotropic etching process using plasma, a plasma damaged region where bonding between semiconductor atoms is broken may be formed in the inner surface of the recess region. Accordingly, resistance of a conductor formed in the recess region may be increased. However, according to embodiments of the inventive concept, since formation of the plasma damaged region in the inner surface of the recess region 115a is minimized or prevented, resistance of the conductor 120 formed in the opening 115 and the recess region 115a is reduced. As a result, a semiconductor device with improved reliability and electrical characteristics is realized.

Furthermore, if the recess region 115a crosses over the sidewall of the opening 115 and extends in a side direction, an area of the conductor 120 formed in the recess region 115a and contacting the substrate 100 is increased. Due to the increase of a contact area between the conductor 120 and the substrate 100, resistance of the conductor 120 is reduced. Accordingly, a semiconductor device with improved reliability and electrical characteristics is realized.

A method of fabricating a semiconductor device according to the above-mentioned embodiments may be applied to multiple manufacturing processes of semiconductor devices. A method of fabricating a semiconductor memory device is described with reference to the drawings. FIGS. 3A through 3J are sectional views illustrating a method of fabricating a semiconductor device according to embodiments of the inventive concept.

Figure 3A:
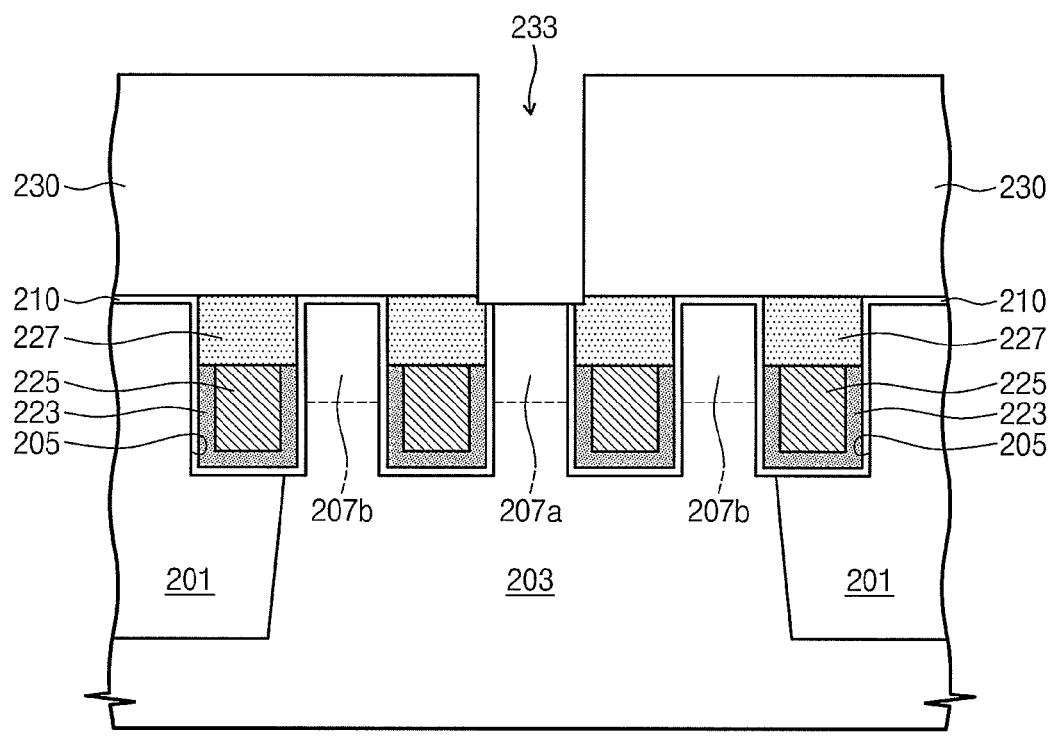
FIGS. 3A through 3J are sectional views illustrating a method of fabricating a semiconductor device according to embodiments of the inventive concept.

Referring to FIG. 3A, a substrate 200 with a device isolation pattern 201 for defining an active part 203 is prepared. The device isolation pattern 201 includes an insulation material. For example, the device isolation pattern 201 includes at least one of oxide, nitride, or oxy-nitride. The substrate 200 includes a semiconductor material. For example, the substrate 200 includes at least one of silicon or germanium.

A trench 205 is formed in the substrate 200. Although not shown in the drawings, the trench 205 extends in a direction, and has a line shape that crosses over the device isolation pattern 201. According to an embodiment, a plurality of trenches 205 are formed in the substrate 200. For example, a pair of the trenches 205 crosses over the active part 203.

A gate electrode is formed in each trench 205. The gate electrode includes a bulk gate pattern 225 and a liner gate pattern 223. The bulk gate pattern 224 is disposed in the trench 205. The liner gate pattern 223 is disposed between the bulk gate pattern 225 and the trench 205. The liner gate pattern 223 and the bulk gate pattern 225 include at least one of doped semiconductor, conductive metal nitride (e.g., titanium nitride, tantalum nitride, or tungsten nitride), or metal (e.g., ruthenium, iridium, titanium, or tantalum). According to an embodiment, the bulk gate pattern 225 and the liner gate pattern 223 include respectively different conductive materials. For example, the bulk gate pattern 225 includes tungsten and the liner gate pattern 223 includes titanium nitride.

A gate dielectric layer 210 is formed between the trench 205 and the liner gate pattern 223. The gate dielectric layer 210 extends along the inner surface of the trench and covers the top surface of the substrate 200. The gate dielectric layer 210 includes at least one of high-k material, oxide, nitride, or oxy-nitride. The high-k material is, for example, an insulation material having a higher dielectric constant than nitride. For example, the high-k material is an insulation metal oxide, such as hafnium oxide and/or aluminum oxide.

A capping pattern 227 is disposed on the gate electrode in the trench 205. The capping pattern 227 covers the top surface of the gate electrode. The capping pattern includes an insulation material. For example, the capping pattern 227 includes at least one of oxide, nitride, or oxy-nitride.

Doping regions 207a and 207b adjacent to the trench 205 may be formed in the active parts 203 at both sides of the trenches 205. According to an embodiment, a first doping region 207a and one pair of second doping regions 207b are formed in the active part 203. The first doping region 207a is formed in the active part 203 between the pair of second doping regions 207b. Additionally, a pair of gate electrodes and the first doping region 207a are formed between the pair of second doping regions 207b.

The bottom surfaces of the doping regions 207a and 207b are formed at a predetermined depth from the top surface of the active part 203. The doping regions 207a and 207b are adjacent to the sidewalls of the trenches 205. The doping regions 207a and 207b are formed through a process for injecting impurities in the active part 203. According to an embodiment, the bottom surfaces of the doping region 207a and 207b are positioned at a higher level than the bottom surface of each trench 205.

A first interlayer insulation layer 230 is formed on the substrate 200. The first interlayer insulation layer 230 is formed through, for example, a PVD process, a CVD process, or an ALD process. The first interlayer insulation layer 230 includes at least one of oxide, nitride, or oxy-nitride.

A first hole 233 penetrating the first interlayer insulation layer 230 and exposing the first doping region 207a of the active part 203 is formed in the first interlayer insulation layer 230. The first hole 233 is formed by forming a first mask pattern on the first interlayer insulation layer 230 and etching the first interlayer insulation layer 230 through the first mask pattern.

According to an embodiment, etching of the first interlayer insulation layer 230 is performed using a first anisotropic etching process with plasma. Since the anisotropic etching process uses plasma, a plasma damaged region may be formed in a top region of the first doping region 207a exposed through the first hole 233. As described above, the plasma damaged region is a region where bonding between semiconductor atoms is broken in the top region of the first doping region 207a by the plasma used during the anisotropic etching process.

Figure 3B:
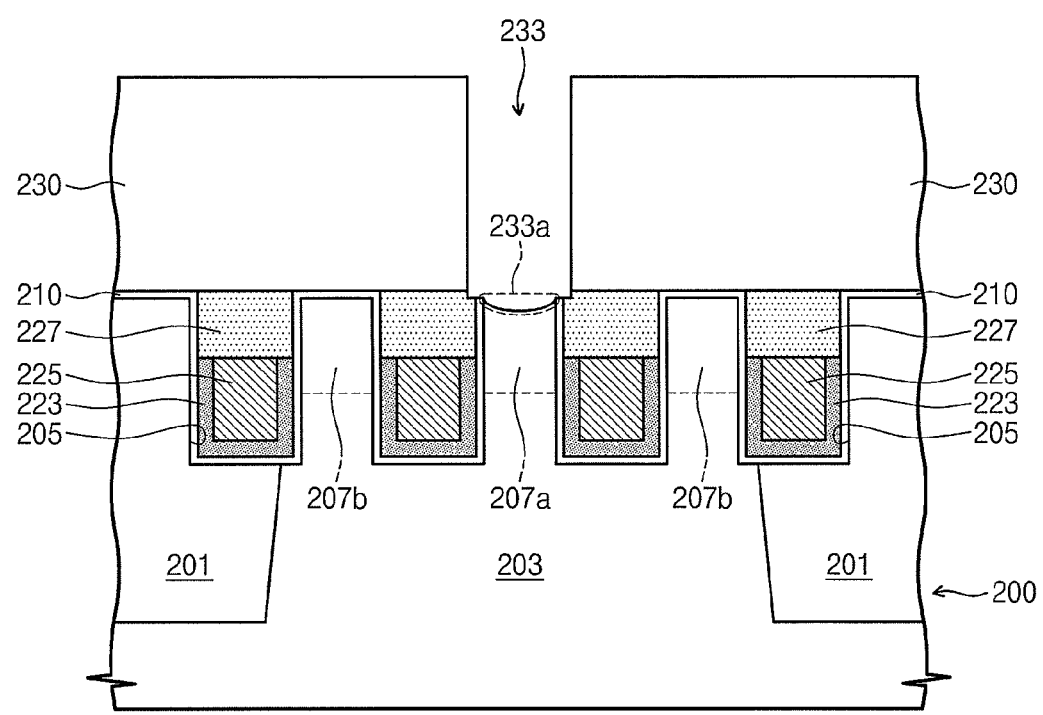

Referring to FIG. 3B, a first recess region 233a is formed in the active part 203 by performing a first plasma-free-etching process on the top region of the active part 203 exposed through the first hole 233.

By performing the first plasma-free-etching process using a first etching gas on the first doping region 207a exposed through the first hole 233, a first recess region 233a is formed in the first doping region 207a. The first plasma-free-etching process does not use plasma and etches a portion of the first doping region 207a when the top region of the first doping region 207a exposed through the first hole 233 reacts with the first etching gas. Since the first plasma-free-etching process is performed without plasma, formation of a plasma damaged region in the inner surface of the first recess region 233a is minimized or prevented.

The first etching gas includes gases that react with a semiconductor element in the first doping region 207a. For example, if the first doping region 207a includes silicon, the first etching gas includes one of interhalogen compound, $F_2$, $XeF_2$ and combinations thereof. For example, the interhalogen compound may be at least one of fluorine-bromine compound (e.g., BrF, $BrF_3$ or $BrF_5$), chlorine-fluorine compound (e.g., ClF, $ClF_3$, or $ClF_5$), or iodine-fluorine compound (e.g., $IF_3$ or $IF_5$).

According to an embodiment, the first etching gas has a high etch selectivity with respect to the first doping region 207a. That is, an etch rate of the first etching gas on the first doping region 207a is higher than an etching rate of the first etching gas on the first interlayer insulation layer 230. For example, if the first doping region 207a includes silicon and the first interlayer insulation layer 230 includes silicon oxide, an etch rate of the first doping region 207a by the first etching gas is more than 100 times higher than that of the first interlayer insulation layer 230 by the first etching gas. Additionally, if the first doping region 207a includes silicon and the first interlayer insulation layer 230 includes silicon nitride, an etch rate of the first doping region 207a by the first etching gas is more than 50 times higher than that of the first interlayer insulation layer 230 by the first etching gas. Accordingly, only the first doping region 207a of the active part 203 may be selectively etched during the first plasma-free-etching process. Accordingly, the first interlayer insulation layer 230 is minimally etched during the first plasma-free-etching process.

According to an embodiment, the first plasma-free-etching process is performed at room temperature to about 300° C. and at a manufacturing pressure of about 0.00001 atm to about 1 atm. According to an embodiment, the first etching gas may further include an inert gas, such as argon, and/or includes nitrogen.

Before performing the first plasma-free-etching process, a first pre-etching process for removing a natural oxide layer formed on the top surface of the first doping region 207a exposed through the first opening 233 is performed.

After the forming of the first opening 233, a natural oxide layer is formed on the top surface of the first doping region 207a exposed through the first opening 233. The first pre-etching process removes the natural oxide layer on the top surface of the first doping region 207a by using a process gas. The first pre-etching process removes the natural oxide layer through a reaction between the natural oxide layer on the top surface of the first doping region 207a and the process gas, without using plasma. Since the first pre-etching process is an etching process without plasma, formation of a plasma damaged region on the surface of the first doping region 207a on which the first pre-etching process is performed is minimized or prevented.

The process gas includes gases that react with an oxide in the natural oxide layer. For example, if the natural oxide layer includes silicon oxide, the process gas includes at least one of ammonia, hydrogen fluoride, or nitrogen fluoride.

According to an embodiment, the first pre-etching process is performed at room temperature to about 300° C. and at a manufacturing pressure of about 0.00001 atm to about 1 atm. According to an embodiment, the process gas further includes an inert gas, such as argon, and/or includes nitrogen.

According to an embodiment, the first pre-etching process is an isotropic etching process. Accordingly, an inner sidewall of the first opening 233 is etched in a side direction during the first pre-etching process. The width of the first opening 233 is increased since the first opening 233 is etched when the process gas used in the first pre-etching process reacts with the first interlayer insulation layer 230 exposed through the first opening 233.

A first hydrogen replacement process is further performed on the substrate 200 having the first recess region 233a. The first hydrogen replacement process includes providing gas with hydrogen on the inner surface of the first recess region 233a and performing a thermal treatment process on the substrate 200. The gas with hydrogen includes at least one of hydrogen fluoride or ammonia. The thermal treatment process is performed at about 150° C. to about 250° C.

A semiconductor-halogen compound, where a halogen element in the first etching gas used in the first plasma-free-etching process and a semiconductor element in the inner surface of the first recess region 233a are combined, is formed in the first recess region 233a. The first hydrogen replacement process changes the semiconductor-halogen compound into a semiconductor-hydrogen compound.

A semiconductor-hydrogen compound having a stronger coherence than a semiconductor-halogen compound is formed in the inner surface of the first recess region 233a through the first hydrogen replacement process so that formation of a natural oxide layer in the inner surface of the first recess region 233a is minimized or prevented.

Figure 3C:
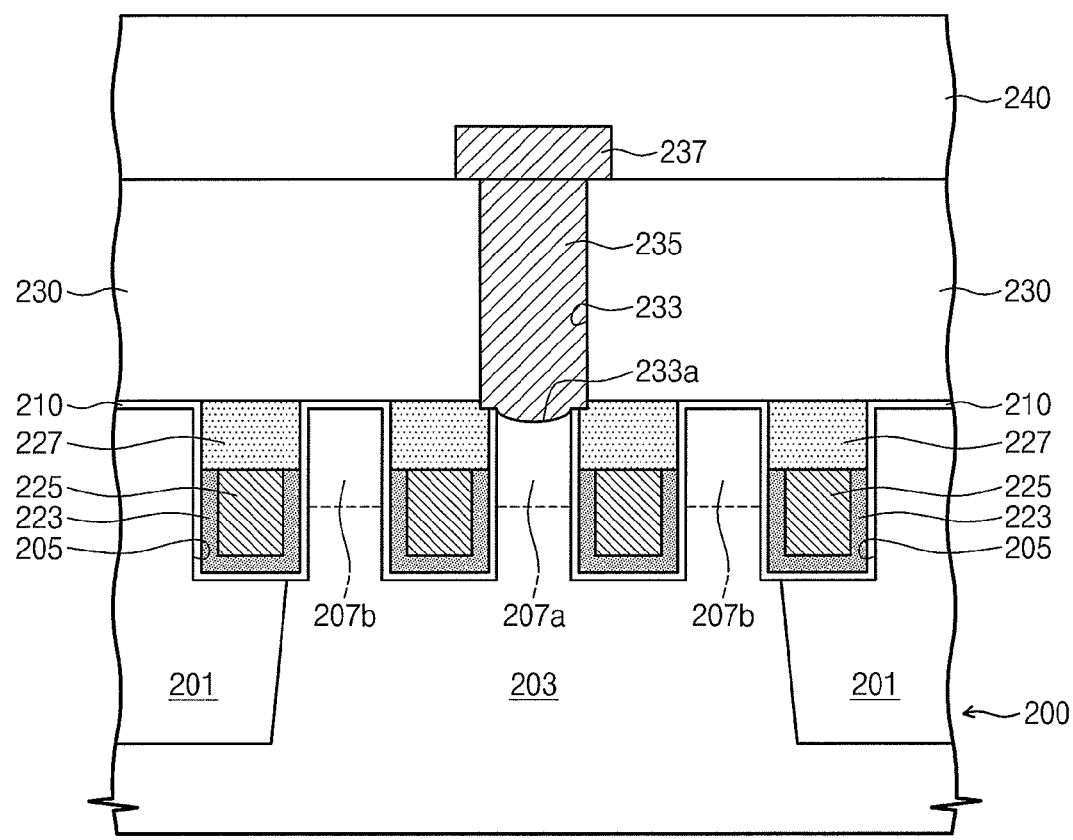

Referring to FIG. 3C, a first contact plug 235 is formed in the first hole 233 and in the first recess region 233a. The first contact plug 235 includes at least one of semiconductor material (e.g., polycrystal silicon), metal-semiconductor compound (e.g., tungsten silicide), conductive metal nitride (e.g., titanium nitride, tantalum nitride or tungsten nitride), or metal (e.g., titanium, tungsten, or tantalum). According to an embodiment, the first contact plug 235 contacts the first opening 233 and the inner surface of the first recess region 233a.

According to embodiments of the inventive concept, after forming the first hole 233, the first recess region 233a is formed through the first plasma-free-etching process without plasma. Accordingly, formation of a plasma damaged region on the inner surface of the first recess region 233a is minimized or prevented. If the recess region is formed through an isotropic etching process using plasma, a plasma damaged region where bonding between semiconductor atoms is broken may be formed in the inner surface of the recess region. Accordingly, resistance of a conductor formed in the recess region may be increased. However, according to embodiments of the inventive concept, since formation of the plasma damaged region in the inner surface of the first recess region 233a is minimized or prevented, interfacial resistance of the first recess region 233a and the first contact plug 235 is reduced. As a result, a semiconductor device with improved reliability and electrical characteristics is realized.

Wiring 237 electrically connected to the first contact plug 235 is formed on the first interlayer insulation layer 230. Although not shown in the drawings, according to an embodiment, the wiring 237 has a line shape extending in a direction intersecting an extension direction of the trench 205. The wiring 237 includes at least one of a semiconductor material (e.g., polycrystal silicon), metal-semiconductor compound (e.g., tungsten silicide), conductive metal nitride (e.g., titanium nitride, tantalum nitride or tungsten nitride), or metal (e.g., titanium, tungsten, or tantalum). The wiring 237 is formed by forming a conductive layer on the first interlayer insulation layer 230 and patterning the conductive layer. Alternatively, the wiring 237 is formed by forming an insulation layer with an opening on the first interlayer insulation layer 230 and filling the opening with a conductive material.

A second interlayer insulation layer 240 covering the wiring 237 is formed on the first interlayer insulation layer 230. The second interlayer insulation layer 240 is formed through a CVD process. The second interlayer dielectric layer 240 includes at least one of oxide, nitride, or oxy-nitride.

Figure 3D:
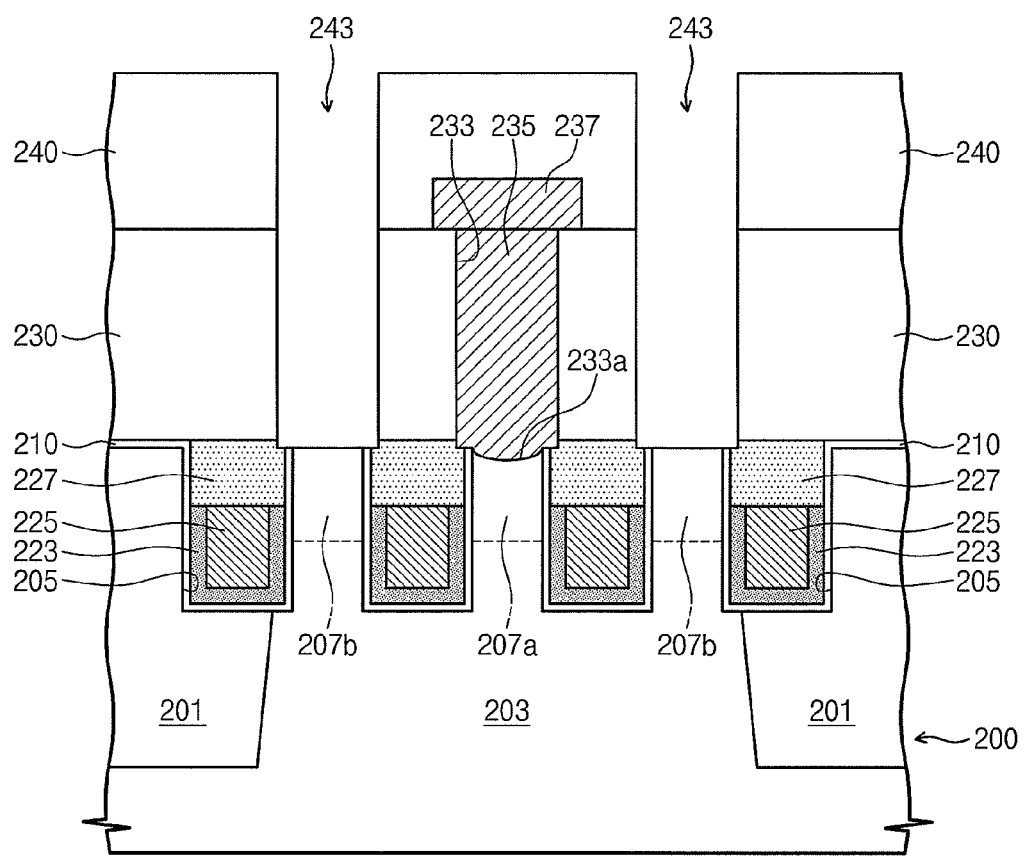

Referring to FIG. 3D, a second hole 243 penetrating the first interlayer insulation layer 230 and the second interlayer insulation layer 240 and exposing the second doping regions 207b of the active part 203 is formed in the first interlayer insulation layer 230 and the second interlayer insulation layer 240. The second holes 243 are formed after forming a second mask pattern on the second interlayer insulation layer 240 and then etching the first interlayer insulation layer 230 and the second interlayer insulation layer 240 using the second mask pattern as an etch mask.

According to an embodiment, etching of the first interlayer insulation layer 230 and the second interlayer insulation layer 240 is performed through a second anisotropic etching process using plasma. Since the second anisotropic etching process uses plasma, plasma damaged regions are formed on the top surface of the second doping regions 207b of the active part 203 exposed through the second holes 243. The plasma damaged region is a region where bonding between semiconductor atoms of the top surface of the second doping regions 207b is broken by the plasma used for the second anisotropic etching process.

Figure 3E:
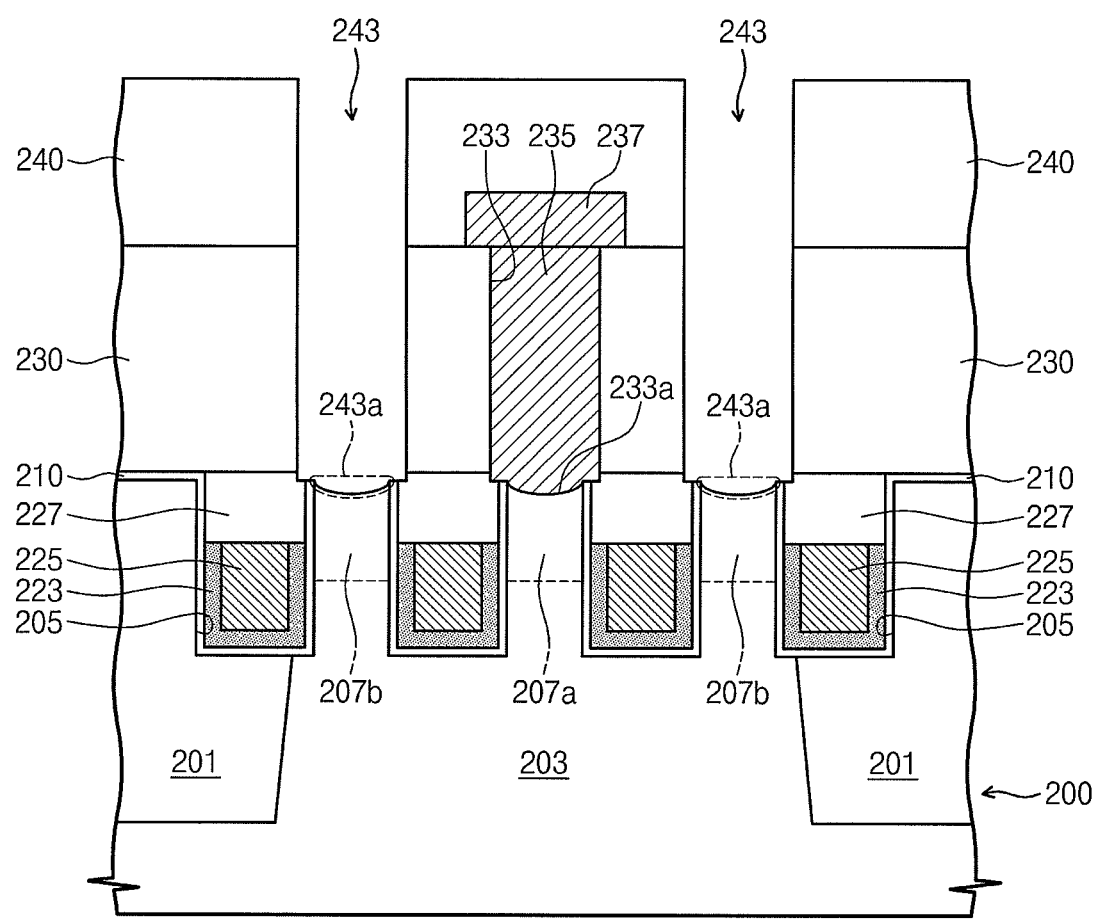

Referring to FIG. 3E, second recess regions 243a are formed in the second doping regions 207b by performing a second plasma-free-etching process on the top surface of the second doping regions 207b exposed through the second holes 243. The second plasma-free-etching process etches a portion of the second doping regions 207b using a second etching gas. The second plasma-free-etching process is the same as or similar to the first plasma-free-etching process for forming the first recess region 233a, which is described with reference to FIG. 3B. Additionally, the second etching gas has the same or similar characteristics as the first etching gas described with reference to FIG. 3B. Accordingly, the second recess regions 243a have the same characteristics as the first recess region 233a.

Before performing the second plasma-free-etching process, a second pre-etching process is performed to remove a natural oxide layer on the top surface of the second doping regions 207b exposed through the second holes 243. The second pre-etching process is the same as, or similar to the first pre-etching process described with reference to FIG. 3B. Accordingly, the second pre-etching process uses, for example, the same or a similar process gas as the first pre-etching process.

A second hydrogen replacement process is further performed on the inner surface of the second recess regions 243a. The second hydrogen replacement process is the same as or similar to the first hydrogen replacement process described with reference to FIG. 3B. Accordingly, the second hydrogen replacement process includes providing gas with hydrogen to the inside of the second recess regions 243a and performing a thermal treatment process on the substrate 200.

A semiconductor-hydrogen compound having a stronger coherence than a semiconductor-halogen compound is formed in the inner surface of the second recess regions 243a through the second hydrogen replacement process so that formation of a natural oxide layer in the inner surface of the second recess regions 243a is minimized or prevented.

Figure 3F:
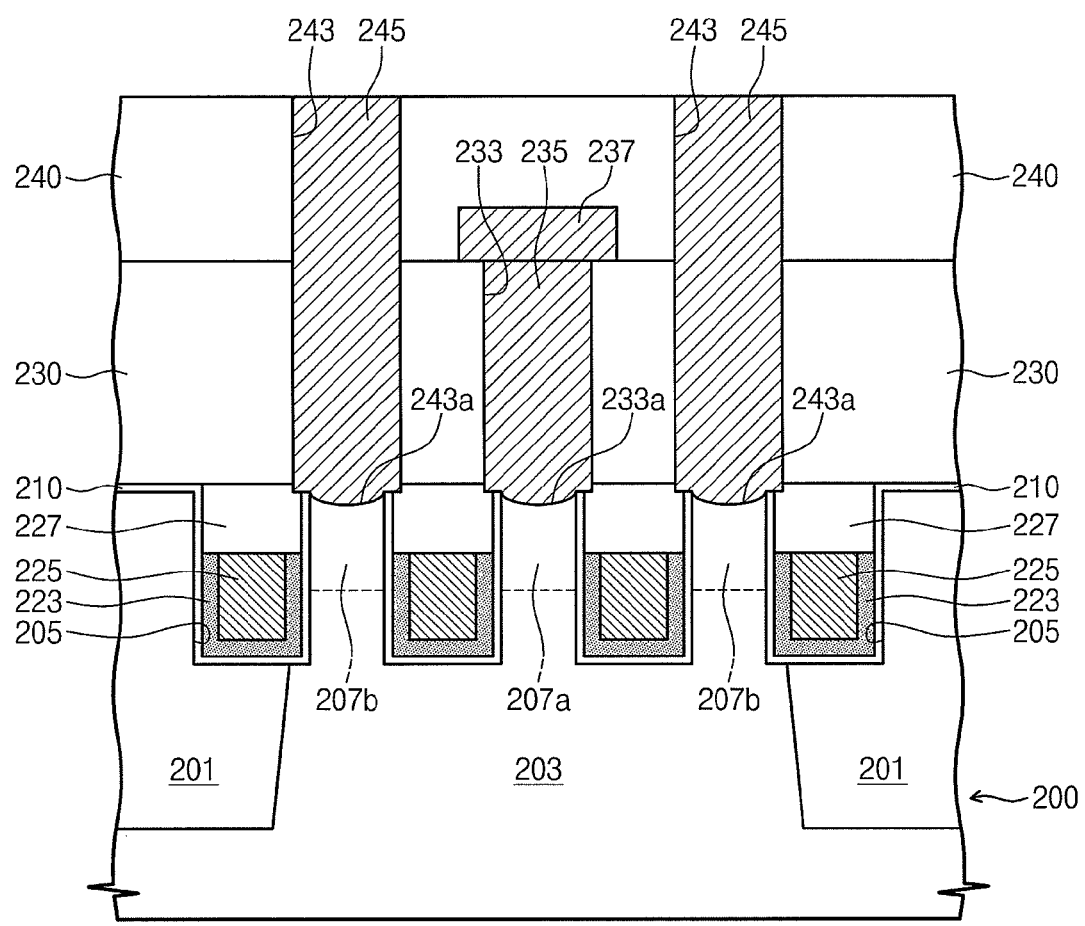

Referring to FIG. 3F, second contact plugs 245 are formed in the second holes 243 and in the second recess regions 243a. The second contact plugs 245 include at least one of semiconductor material (e.g., polycrystal silicon), metal-semiconductor compound (e.g., tungsten silicide), conductive metal nitride (e.g., titanium nitride, tantalum nitride or tungsten nitride), or metal (e.g., titanium, tungsten, or tantalum). According to an embodiment, a second contact plug 245 contacts a second opening 243 and an inner surface of a second recess region 243a.

According to embodiments of the inventive concept, the second recess regions 243a have the same characteristic as and are formed through the same method as the first recess region 233a described with reference to FIG. 3B. Accordingly, since formation of a plasma damaged region at the inner surface of the second recess regions 243a is minimized or prevented, the resistance of the second contact plugs 245 formed in the second holes 243 and the second recess regions 243a is reduced. As a result, semiconductor devices with improved reliability and electrical characteristics are realized.

Figure 3G:
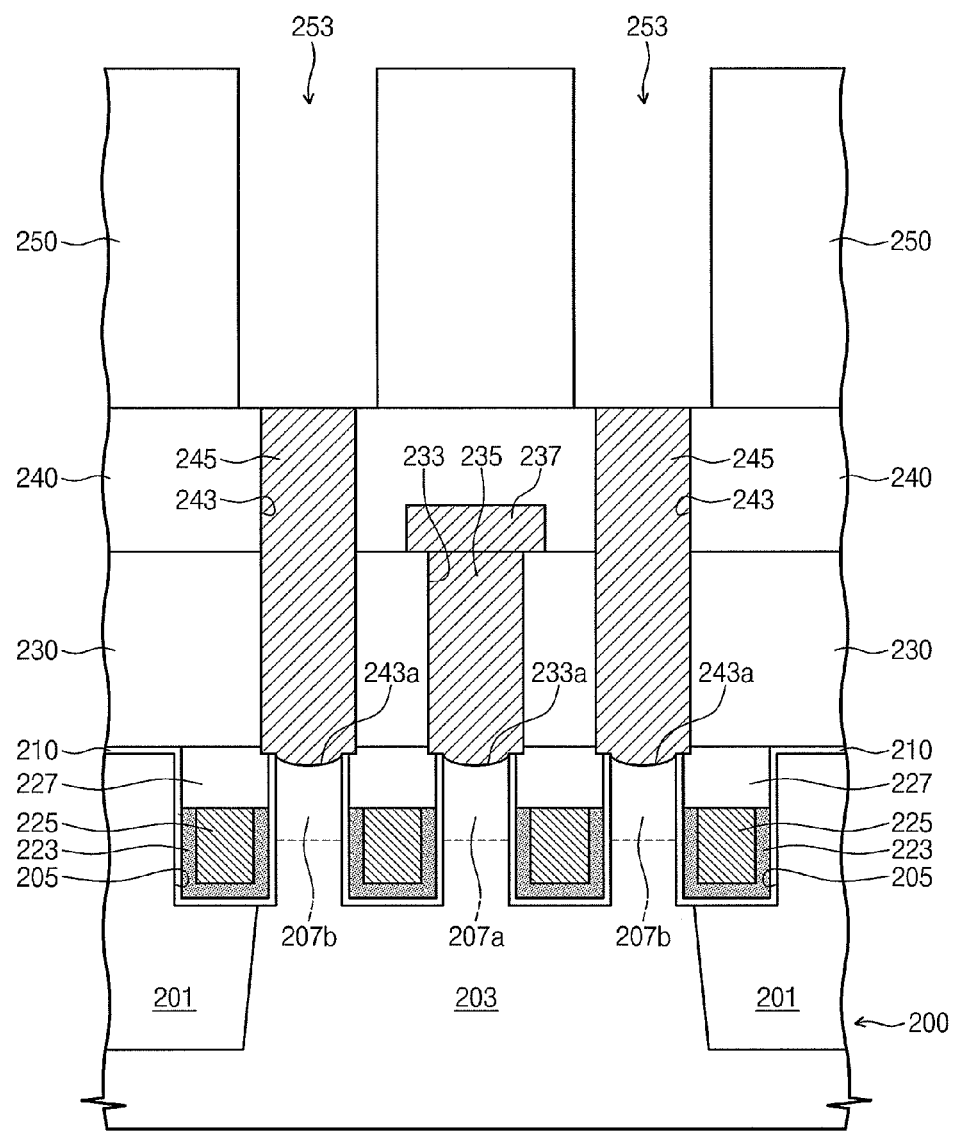

Referring to FIG. 3G, a sacrificial layer 250 is formed on the second interlayer insulation layer 240. Third holes 253 exposing the second contact plugs 245 are formed in the sacrificial layer 250. The forming of the third holes 253 includes forming a third mask pattern on the sacrificial layer 250 and etching the sacrificial layer 250 using the third mask pattern as an etch mask.

According to an embodiment, the etching of the sacrificial layer 250 is performed using a third anisotropic etching process using plasma. According to an embodiment, the sacrificial layer 250 is anisotropically etched through the third anisotropic etching process. Since the third anisotropic etching process uses plasma, a plasma damaged region is formed in the top region of the second contact plugs 245 exposed through the third holes 253. The plasma damaged region is a region where bonding between atoms in the top region of the second contact plugs 245 is broken by the plasma used for the third anisotropic etching process.

Figure 3H:
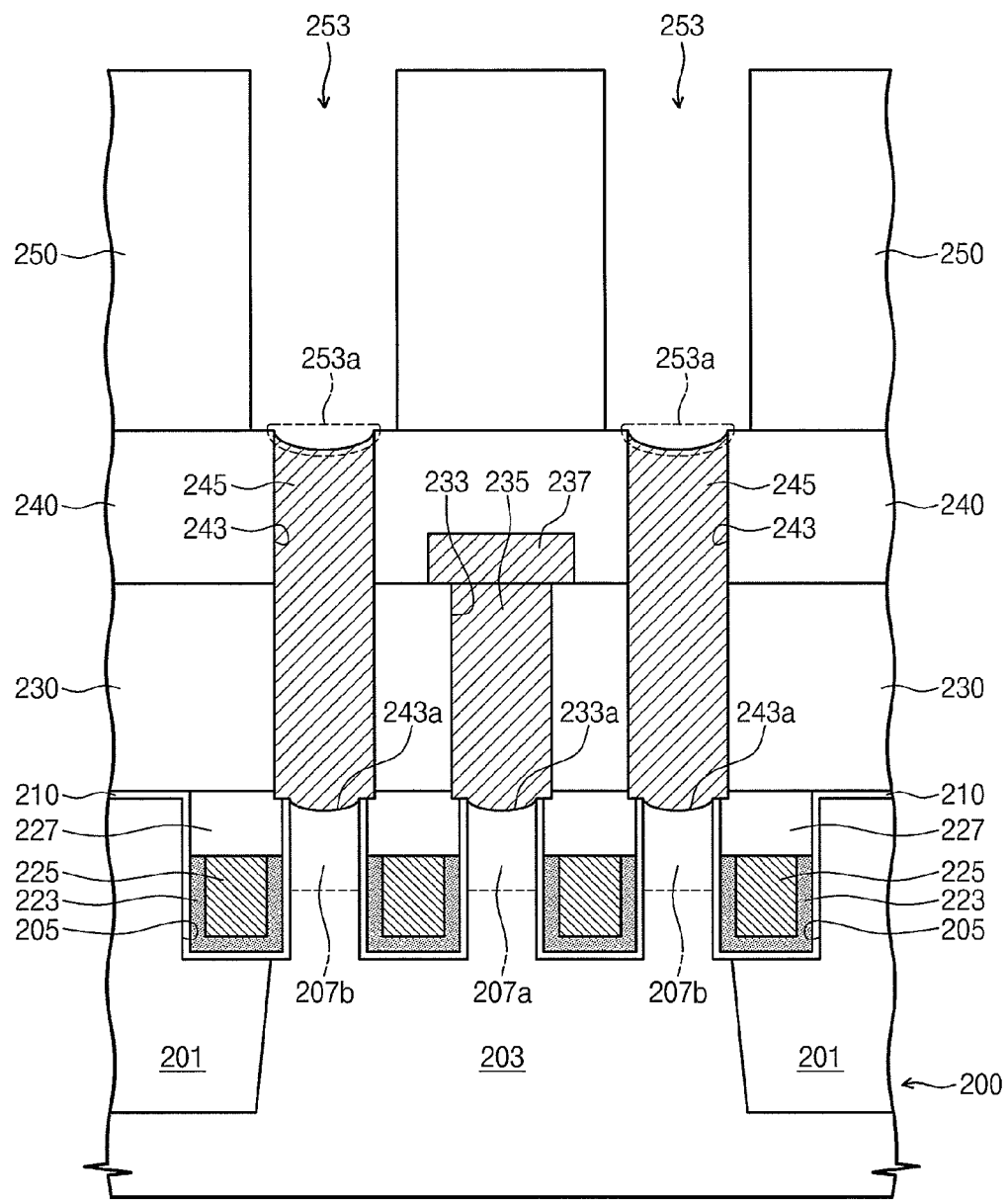

Referring to FIG. 3H, third recess regions 253*a* are formed in the second contact plugs 245 by performing a third plasma-free-etching process on the top region of the second contact plugs 245 exposed through the third holes 253.

The third plasma-free-etching process etches a portion of the second contact plugs 245 by using a third etching gas. The third plasma-free-etching process is the same as or similar to the first plasma-free-etching process for forming the first recess region 233*a*. Additionally, the third etching gas has the same or similar characteristics as the first etching gas described with reference to FIG. 3B. Accordingly, the third recess regions 253*a* have the same or similar characteristics as the first recess region 233*a*.

Before performing the third plasma-free-etching process, a third pre-etching process is performed to remove a natural oxide layer on the top surface of the second contact plugs 245 exposed through the third holes 253. The third pre-etching process is the same as or similar to the first pre-etching process described with reference to FIG. 3B. Accordingly, the third pre-etching process uses, for example, the same or a similar process gas as the first pre-etching process.

A third hydrogen replacement process is further performed on the inner surface of the third recess regions 253*a*. The third hydrogen replacement process is the same as or similar to the first hydrogen replacement process described with reference to FIG. 3B. Accordingly, the third hydrogen replacement process includes providing gas with hydrogen to the inside of the third recess regions 253*a* and performing a thermal treatment process on the substrate 200.

A semiconductor-hydrogen compound having a stronger coherence than a semiconductor-halogen compound is formed in the inner surface of the third recess regions 253*a* through the third hydrogen replacement process so that formation of a natural oxide layer in the inner surface of the third recess regions 253*a* is minimized or prevented.

Figure 3I:
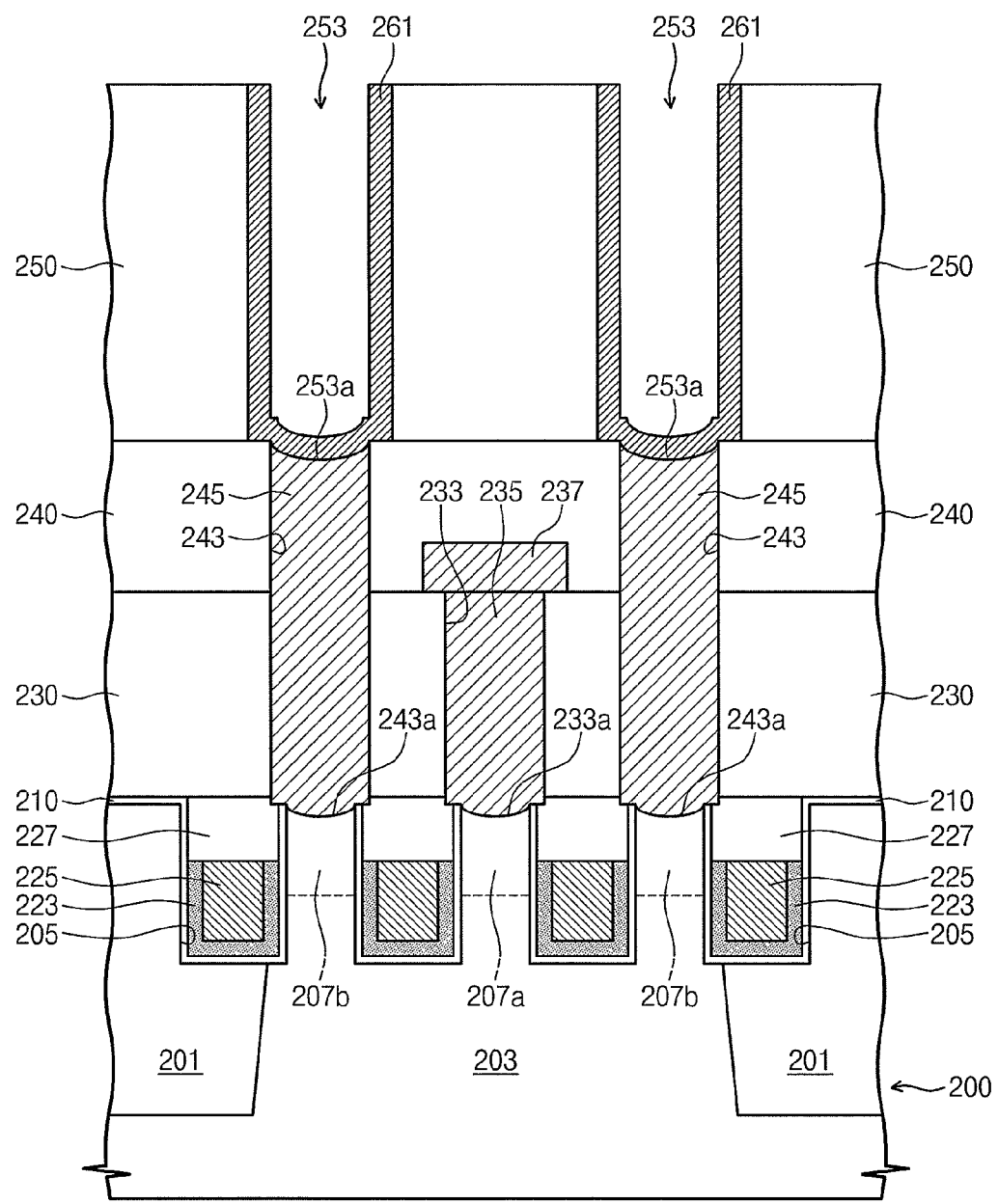

Referring to FIG. 3I, first electrodes 261 conformally covering the third holes 253 and the inner surface of the third recess regions 253*a* are formed. According to an embodiment, the first electrodes 261 have a cylindrical shape. The first electrode 261 includes conductive material. For example, the first electrode 261 includes at least one of a doped semiconductor, conductive metal nitride (e.g., titanium nitride, tantalum nitride or tungsten nitride), or metal (e.g., ruthenium, iridium, titanium, or tantalum), and conductive metal oxide (e.g., iridium oxide).

Figure 3J:
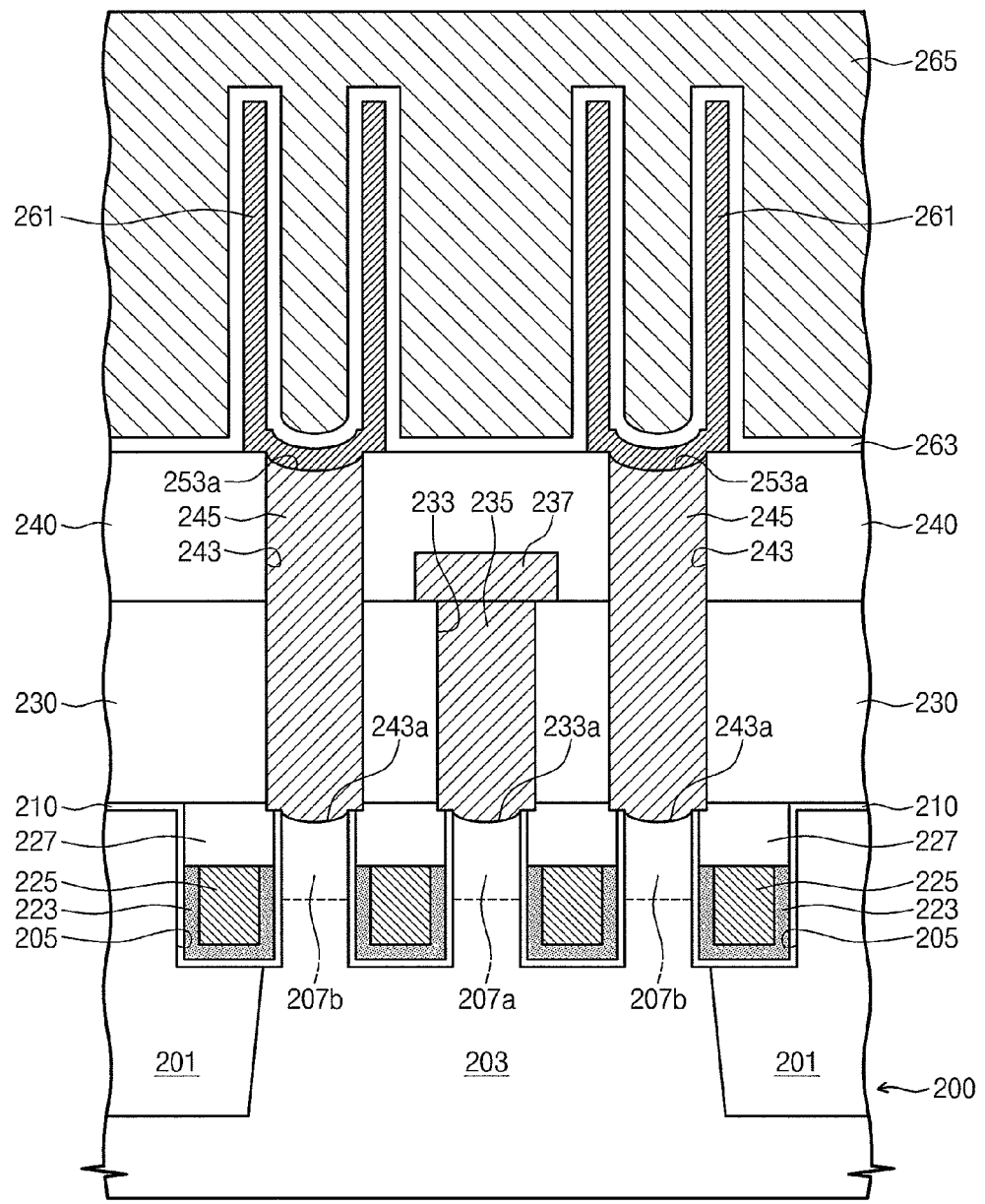

Referring to FIG. 3J, after removing the sacrificial layer 250, a capacitor dielectric layer 263 is conformally formed on the second interlayer insulation layer 240 and on the first electrodes 261. According to an embodiment, the capacitor dielectric layer 263 covers an entire surface of the first electrodes 261. The capacitor dielectric layer 263 includes at least one of oxide, nitride, oxy-nitride, or high-k material A second electrode 265 covering the capacitor dielectric layer 263 is disposed on the second interlayer insulation layer 240. The second electrode 265 includes conductive material. For example, the second electrode 265 includes at least one of doped semiconductor, metal, conductive metal nitride, and metal silicide.

A first electrode 261, the capacitor dielectric layer 263, and the second electrode 265 form a capacitor. As mentioned above, the third recess regions 253*a* are formed through the same or similar method as or have the same or similar characteristics as the first recess region 233*a* described with reference to FIG. 3B. Thus, according to the above embodiment, since a plasma-damaged region is minimally formed in the third recess regions 253*a*, an interfacial resistance between the first electrodes 261 and the second contact plugs 245 formed in the third recess regions 253*a* is reduced. As a result, semiconductor devices with improved reliability and electrical characteristics are realized.

Figure 4:
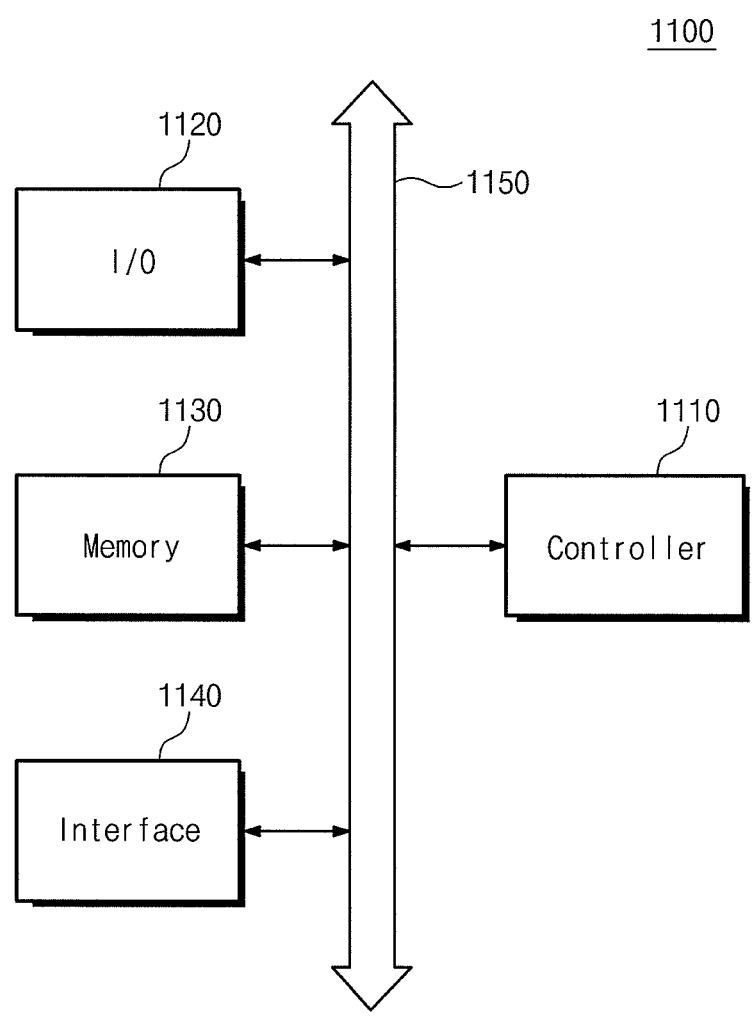
FIG. 4 is a block diagram illustrating an electronic system including a semiconductor device according to embodiments of the inventive concept.

FIG. 4 is a block diagram illustrating an electronic system including a semiconductor device according to an embodiment of the inventive concept.

Referring to FIG. 4, the electronic system 1100 includes a controller 1110, an input/output device (I/O) 1120, a memory 1130, an interface 1140, and a bus 1150. The controller 1110, I/O device 1120, memory 1130, and/or interface 1140 are connected through the bus 1150. The bus 1150 corresponds to a path through which data is transferred.

The controller 1110 includes at least one of a microprocessor, a digital signal processor, a microcontroller, and logic devices for performing similar functions similar to each other. The I/O device 1120 includes, for example, a keypad, a keyboard, and/or a display device. The memory 1130 stores data and/or commands. The memory 1130 includes at least one of the semiconductor devices disclosed in the above embodiments. Additionally, the memory 1130 may further include a different form of semiconductor devices (e.g., nonvolatile memory device and/or SRAM device). The different form of semiconductor devices may be in the form of one the semiconductor devices disclosed in the above embodiments. The interface 1140 performs functions for transmitting data to a communication network and/or receiving data from a communication network. The interface 1140 has a wired or wireless form. For example, the interface 1140 includes an antenna or wired/wireless transceiver. Although not shown in the drawings, the electronic system 1100 may further include a high-speed SRAM device as an operating memory device to improve operations of the controller 1110.

The electronic system 1100 may be applied to, for example, a Personal Digital Assistant (PDA), a portable computer, a web tablet, a wireless phone, a mobile phone, a digital music player, a memory card, or any electronic products for transmitting and/or receiving information in a wireless environment.

Figure 5:
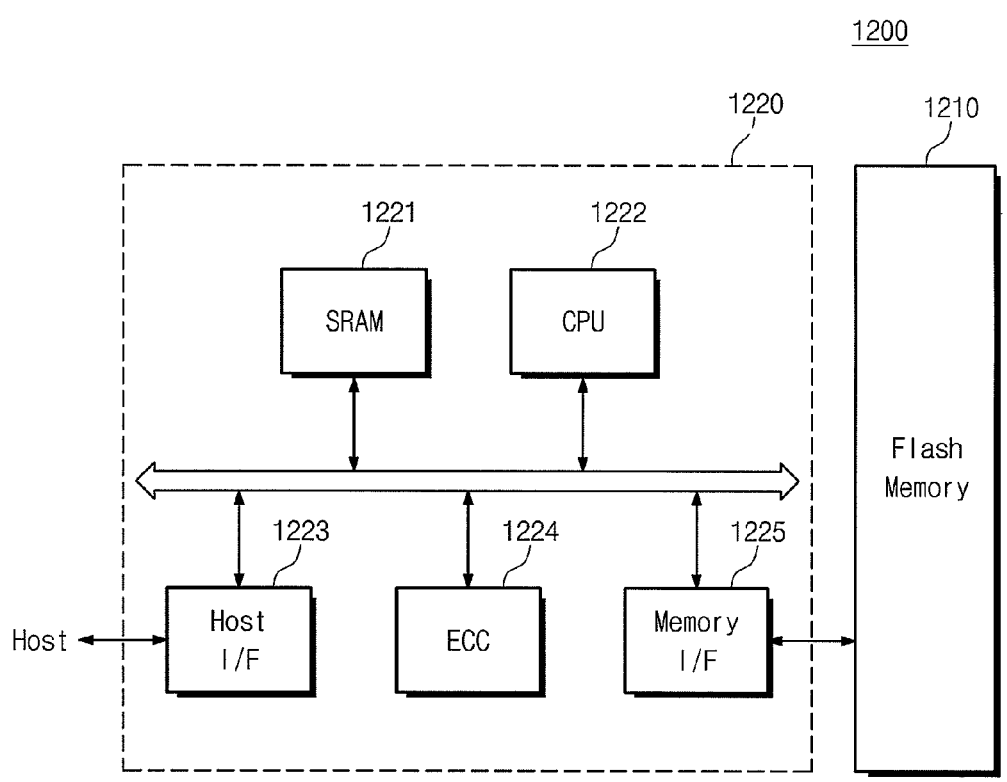
FIG. 5 is a block diagram illustrating a memory card with a semiconductor device according to embodiments of the inventive concept.

FIG. 5 is a block diagram illustrating a memory card with a semiconductor device according to embodiments of the inventive concept.

Referring to FIG. 5, the memory card 1200 includes a flash memory 1210. The flash memory 1210 includes at least one of the semiconductor devices disclosed in the above embodiments. Additionally, the flash memory 1210 may further include a different form of semiconductor devices (e.g., a nonvolatile memory device and/or an SRAM device). The different form of semiconductor devices may be in the form of one of the semiconductor devices disclosed in the above embodiments. The memory card 1200 includes a memory controller 1220 for controlling data exchanges between a host and the flash memory 1210.

The memory controller 1220 includes a Central Processing Unit (CPU) 1222 for controlling general operations of the memory card. Additionally, the memory controller 1220 includes an SRAM 1221 used as an operating memory of the CPU 1222. Furthermore, the memory controller 1220 further includes a host interface (I/F) 1223 and a memory interface (I/F) 1225. The memory I/F connects the memory controller 1220 with the flash memory 1210. Furthermore, the memory controller 1220 further includes an Error Correction Code (ECC) unit 1224. The ECC unit 1224 detects and corrects errors of data read from the flash memory 1210. Although not shown in the drawings, the memory card 1200 may further include a ROM device for string code data to interface with the host. The memory card 1200 may be used as a portable data storage card. Alternatively, the memory card 1200 may be formed with a Solid State Disk (SSD) that may replace a hard disk of a computer system.

The semiconductor devices disclosed in the above embodiments may be included in various forms of semiconductor packages. For example, the semiconductor devices may be packaged through various methods such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

A package where a semiconductor device according to embodiments of the inventive concept is mounted may further include a controller and/or a logic device for controlling the semiconductor device.

According to the methods of fabricating a semiconductor device in accordance with embodiments of the inventive concept, an etching target is etched by a plasma-free-etching process. Since the plasma-free-etching process does not use plasma, damage to the surface of the etched etching target is minimal or is prevented. Accordingly, semiconductor devices with improved reliability and electrical characteristics are realized.

Additionally, in accordance with embodiments of the inventive concept, the plasma-free-etching-process uses an etching gas including at least one of interhalogen compound, $F_2$, and $XeF_2$. The etching gas has a higher etch selectivity with respect to an etching target. Accordingly, during the plasma-free-etching process, etching of thin layers other than an etching target is minimal. Accordingly, a manufacturing process margin of a semiconductor device is obtained.

Although embodiments of the present inventive concept have been shown and described, it will be appreciated by those skilled in the art that changes may be made without departing from the principles and spirit of the inventive concept, the scope of which is defined in the appended claims.

What is claimed is:

1. A method of fabricating a semiconductor device, the method comprising:
   preparing a substrate with an etching target; and
   etching the etching target using a plasma-free etching process that uses an etching gas including one of an interhalogen compound, $F_2$, $XeF_2$, or combinations thereof, and
   performing a hydrogen replacement process on the substrate after the plasma-free etching process is performed, wherein the hydrogen replacement process includes providing gas including hydrogen on the substrate; and performing a thermal treatment process on the substrate,
   wherein a semiconductor-halogen compound formed from a halogen element in the etching gas and a semiconductor element in the substrate are changed into a semiconductor-hydrogen compound,
   wherein the etching target comprises a plasma damaged region.

2. The method of claim 1, wherein the plasma damaged region is removed through the plasma-free etching process.

3. The method of claim 1, wherein the gas with hydrogen comprises one of hydrogen fluoride, ammonia, nitrogen fluoride, and combinations thereof.

4. The method of claim 1, wherein the plasma-free etching process is an isotropic etching process.

5. The method of claim 1, wherein the plasma-free etching process is performed at room temperature to about 300° C. and at 0.00001 atm to about 1 atm.

6. The method of claim 1, wherein the etching gas further comprises an inert gas.

7. The method of claim 1,
   wherein preparing the substrate with the etching target comprises:
      forming an insulation layer on the substrate; and
      forming an opening that penetrates the insulation layer and exposes a portion of the substrate, and
   wherein the etching of the etching target comprises forming a recess region in the substrate by etching the exposed portion substrate.

8. The method of claim 7, wherein a longest width of the recess region is wider than a width of a bottom end of the opening.

9. The method of claim 7, further comprising forming a conductor in the opening and in the recess region.

10. The method of claim 1,
   wherein the etching target comprises a natural oxide layer, and
   wherein the method further comprises, performing a pre-etching process for removing the natural oxide layer before performing of the plasma-free etching process.

11. The method of claim 10, wherein the pre-etching process uses a gas including at least one of hydrogen fluoride, ammonia, or nitrogen fluoride.

12. The method of claim 11, wherein the gas of the pre-etching process further comprises an inert gas.

13. A method of fabricating a semiconductor device, the method comprising:
   preparing a substrate with an etching target comprising a natural oxide layer
   performing a pre-etching process to remove the natural oxide layer;
   etching the etching target, after performing the pre-etching process, using a plasma-free etching process that uses an etching gas including one of an interhalogen compound, $F_2$, $XeF_2$, or combinations thereof; and
   performing a hydrogen replacement process on the substrate after the plasma-free etching process is performed,
   wherein a semiconductor-halogen compound formed from a halogen element in the etching gas and a semiconductor element in the substrate are changed into a semiconductor-hydrogen compound,
   wherein the etching target comprises a portion on which the pre-etching process is performed, and
   wherein the plasma-free etching process and the hydrogen replacement process are performed on the portion of the etching target.

14. The method of claim 13, wherein the pre-etching process uses a gas including at least one of hydrogen fluoride, ammonia, or nitrogen fluoride.

15. The method of claim 14, wherein the gas of the pre-etching process further comprises an inert gas.

* * * * *